(12) United States Patent
Chepulskyy et al.

(10) Patent No.: US 10,121,960 B2
(45) Date of Patent: Nov. 6, 2018

(54) METHOD AND SYSTEM FOR PROVIDING MAGNETIC JUNCTIONS USABLE IN SPIN TRANSFER TORQUE APPLICATIONS UTILIZING INTERSTITIAL GLASS-FORMING AGENT(S)

(71) Applicant: Samsung Electronics Co., LTD., Gyeonggi-do (KR)

(72) Inventors: Roman Chepulskyy, Milpitas, CA (US); Dmytro Apalkov, San Jose, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/373,396

(22) Filed: Dec. 8, 2016

(65) Prior Publication Data

US 2018/0108833 A1    Apr. 19, 2018

Related U.S. Application Data

(60) Provisional application No. 62/409,298, filed on Oct. 17, 2016.

(51) Int. Cl.
| | |
|---|---|
| *H01L 21/00* | (2006.01) |
| *H01L 21/76* | (2006.01) |
| *H01L 43/08* | (2006.01) |
| *H01L 43/12* | (2006.01) |
| *G11C 11/16* | (2006.01) |
| *H01L 43/10* | (2006.01) |

(52) U.S. Cl.
CPC ............ *H01L 43/08* (2013.01); *G11C 11/161* (2013.01); *H01L 43/10* (2013.01); *H01L 43/12* (2013.01)

(58) Field of Classification Search
CPC ......... H01L 43/08; H01L 43/12; H01L 43/02; H01L 43/10; H01L 27/222; G11C 11/161; G11C 11/1675; B82Y 25/00
USPC ...................................... 257/421, 108; 438/3
See application file for complete search history.

(56) References Cited

U.S. PATENT DOCUMENTS

| | | | | |
|---|---|---|---|---|
| 5,406,123 | A | * | 4/1995 | Narayan ........... H01L 21/28575 257/190 |
| 7,193,284 | B2 | | 3/2007 | Yagami |
| 7,196,386 | B2 | | 3/2007 | Kadono |
| 7,933,145 | B2 | | 4/2011 | Yamagishi |

(Continued)

*Primary Examiner* — Thao X Le
*Assistant Examiner* — Nduka Ojeh
(74) *Attorney, Agent, or Firm* — Van Pelt, Yi & James LLP (57) ABSTRACT

A magnetic junction and method for providing the magnetic junction are described. The method includes providing a free layer, providing a pinned layer and providing a nonmagnetic spacer between the free and pinned layers. The free layer is switchable between stable magnetic states using a write current passed through the magnetic junction. At least one of the step of providing the free layer and the step of providing the pinned layer includes depositing a magnetic layer; depositing an adsorber layer on the magnetic layer and performing at least one anneal. The magnetic layer is amorphous as-deposited and includes an interstitial glass-promoting component. The adsorber layer attracts the interstitial glass-promoting component and has a lattice mismatch with the nonmagnetic spacer layer of not more than ten percent. Each of the anneal(s) is at a temperature greater than 300 degrees Celsius and not more than 425 degrees Celsius.

12 Claims, 6 Drawing Sheets

(56) References Cited

U.S. PATENT DOCUMENTS

| | | |
|---|---|---|
| 8,319,297 B2 | 11/2012 | Min |
| 8,441,082 B2 | 5/2013 | Ohmori |
| 8,586,390 B2 | 11/2013 | Tomioka |
| 2007/0074317 A1* | 3/2007 | Pakala .................. B82Y 25/00 257/108 |
| 2012/0032288 A1 | 2/2012 | Tomioka |
| 2014/0175581 A1* | 6/2014 | Guo ....................... H01L 43/08 257/421 |
| 2014/0183673 A1* | 7/2014 | Zhang ................... H01L 29/82 257/421 |
| 2014/0248719 A1* | 9/2014 | Zhou .................... G11C 11/161 438/3 |
| 2015/0129994 A1 | 5/2015 | Bowen |
| 2015/0294707 A1* | 10/2015 | Apalkov ................ H01L 43/08 365/158 |
| 2016/0211444 A1* | 7/2016 | Voznyuk ................ H01L 43/12 |
| 2017/0140784 A1* | 5/2017 | Sukegawa ............. G11B 5/653 |
| 2017/0141296 A1* | 5/2017 | Apalkov ................ H01L 43/08 |
| 2017/0170390 A1* | 6/2017 | Swerts ................... H01L 43/08 |
| 2017/0294482 A1* | 10/2017 | Hu ........................ H01L 27/226 |
| 2018/0090677 A1* | 3/2018 | Sasaki .................... H01L 43/08 |

* cited by examiner

METHOD AND SYSTEM FOR PROVIDING MAGNETIC JUNCTIONS USABLE IN SPIN TRANSFER TORQUE APPLICATIONS UTILIZING INTERSTITIAL GLASS-FORMING AGENT(S)

CROSS-REFERENCE TO RELATED APPLICATIONS

This application claims the benefit of provisional Patent Application Ser. No. 62/409,298, filed Oct. 17, 2016, entitled REDUCING RAPID THERMAL ANNEAL (RTA) TEMPERATURES IN PT-BASED FL BY USING CARBON GLASS FORMING AGENT (GFA), assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ typically resides on a substrate. The conventional MTJ, uses conventional seed layer(s), may include capping layers and may include a conventional antiferromagnetic (AFM) layer. The conventional MTJ includes a conventional pinned layer, a conventional free layer and a conventional tunneling barrier layer between the conventional pinned and free layers. A bottom contact below the conventional MTJ and a top contact on the conventional MTJ may be used to drive current through the conventional MTJ in a current-perpendicular-to-plane (CPP) direction.

The conventional pinned layer and the conventional free layer are magnetic. The magnetization of the conventional pinned layer is fixed, or pinned, in a particular direction. The conventional free layer has a changeable magnetization. The conventional free layer may be a single layer or include multiple layers.

To switch the magnetization of the conventional free layer, a current is driven perpendicular to plane. When a sufficient current is driven from the top contact to the bottom contact, the magnetization of the conventional free layer may switch to be parallel to the magnetization of a conventional bottom pinned layer. When a sufficient current is driven from the bottom contact to the top contact, the magnetization of the free layer may switch to be antiparallel to that of the bottom pinned layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. Mechanisms for improving the performance of STT-MRAM are desired. For example, a low switching current and high magnetoresistance may be desired for improved switching and signal. Concurrently, the magnetic junction is desired to remain thermally stable. In addition, the processes used in fabricating portions of the magnetic junction are desired not to damage other structures. Accordingly, what is needed is a method and system that may improve the performance and manufacturability of spin transfer torque based memories. The method and system described herein address such a need.

BRIEF SUMMARY OF THE INVENTION

A magnetic junction and method for providing the magnetic junction are described. The magnetic junction is in a substrate and is usable in a magnetic device. The method includes providing a free layer, providing a pinned layer and providing a nonmagnetic spacer between the free and pinned layers. The free layer is switchable between stable magnetic states using a write current passed through the magnetic junction. At least one of the step of providing the free layer and the step of providing the pinned layer includes depositing a magnetic layer; depositing an adsorber layer on the magnetic layer and performing at least one anneal. The magnetic layer is amorphous as-deposited and includes an interstitial glass-promoting component. The adsorber layer attracts the interstitial glass-promoting component and has a lattice mismatch with the nonmagnetic spacer layer of not more than ten percent. Each of the anneal(s) is at a temperature greater than 300 degrees Celsius and not more than 425 degrees Celsius.

The magnetic junction may have improved performance. The magnetic layer may have an improved crystallization at lower anneal temperatures. As a result, fabrication may be facilitated and performance may be improved.

DETAILED DESCRIPTION OF THE INVENTION

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction and method for providing the magnetic junction are described. The magnetic junction is in a substrate and is usable in a magnetic device. The method includes providing a free layer, providing a pinned layer and providing a nonmagnetic spacer between the free and pinned layers. The free layer is switchable between stable magnetic states using a write current passed through the magnetic junction. At least one of the step of providing the free layer and the step of providing the pinned layer includes depositing a magnetic layer; depositing an adsorber layer on the magnetic layer and performing at least one anneal. The magnetic layer is amorphous as-deposited and includes an interstitial glass-promoting component. The adsorber layer attracts the interstitial glass-promoting component and has a lattice mismatch with the nonmagnetic spacer layer of not more than ten percent. Each of the anneal(s) is at a temperature greater than 300 degrees Celsius and not more than 425 degrees Celsius.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. The method and system are also described in the context of certain alloys. Unless otherwise specified, if specific concentrations of the alloy are not mentioned, any stoichiometry not inconsistent with the method and system may be used. For example, CoFeC refer to a cobalt-iron carbon that may be within the stoichiometry ranges described herein.

Figure 1:
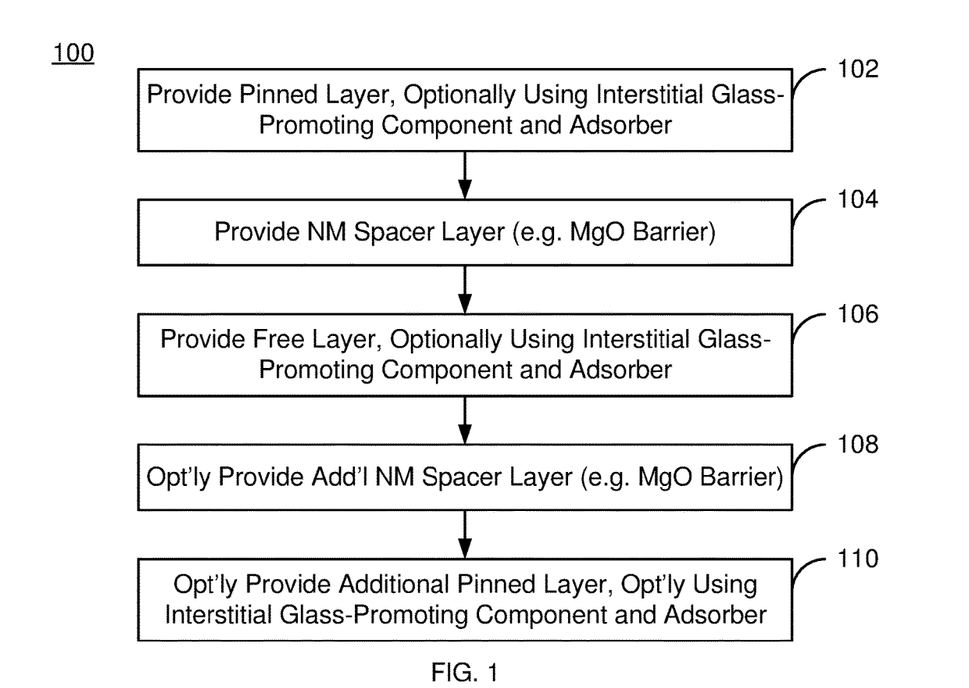
FIG. 1 is a flow chart depicting an exemplary embodiment of a method for providing a magnetic junction including an interstitial glass-promoting component and an adsorber, usable in a magnetic memory and programmable using spin transfer torque.

FIG. 1 depicts an exemplary embodiment of a method 100 for fabricating a magnetic junction usable in a magnetic device such as a spin transfer torque random access memory (STT-RAM) and, therefore, in a variety of electronic devices. For simplicity, some steps may be omitted, performed in another order and/or combined. Further, the method 100 may start after other steps in forming a magnetic memory have been performed. The method 100 is also described in the context of forming a single magnetic junction. However, multiple magnetic junctions may be formed substantially simultaneously.

A pinned layer is provided, via step 102. The pinned layer is magnetic and may have its magnetization pinned, or fixed, in a particular direction during at least a portion of the operation of the magnetic junction. The pinned layer may thus be thermally stable at operating temperatures. The pinned layer formed in step 102 may be a simple (single) layer or may include multiple layers. For example, the pinned layer formed in step 102 may be a synthetic antiferromagnet (SAF) including magnetic layers antiferromagnetically or ferromagnetically coupled through thin nonmagnetic layer(s), such as Ru. In such a SAF, each magnetic layer may also include multiple layers. The pinned layer may also be another multilayer. The pinned layer formed in step 102 may have a perpendicular anisotropy energy that exceeds the out-of-plane demagnetization energy. Thus, the pinned layer may have its magnetic moment oriented perpendicular to plane. Other orientations of the magnetization of the pinned layer are possible.

The pinned layer may be deposited on seed layer(s) if the magnetic junction being formed is a bottom pinned magnetic junction or a dual magnetic junction. The seed layer(s) may be selected for various purposes including but not limited to the desired crystal structure of the pinned layer, magnetic anisotropy and/or other magnetic characteristics of the pinned layer. For example, the pinned layer may be provided on a seed layer such as a (100) crystalline MgO layer that promotes a perpendicular magnetic anisotropy in the pinned layer. If a top pinned magnetic junction is being fabricated, the pinned layer may be formed on a nonmagnetic spacer layer, described below. In such an embodiment, the free layer formed in step 106 is provided first. In some embodiments, the perpendicular magnetic anisotropy energy of the pinned layer formed in step 102 may exceed the out-of-plane demagnetization energy. Thus, the magnetic moment of the pinned layer may be out-of-plane. For example, the magnetic moment may be perpendicular to plane.

In addition, one or more polarization enhancement layers (PELs) may be provided as part of or in addition to the pinned layer. A PEL includes high spin polarization materials. For example, a CoFeB PEL may be provided before and immediately after the pinned layer is formed in step 102. In other embodiments, one or both of these PELs may be omitted.

Providing the pinned layer in step 102 may include multiple steps that may be seen as forming a magnetic substructure. For example, a magnetic layer including at least one interstitial glass-promoting component may be deposited. Such a magnetic layer is amorphous as-deposited. A glass-promoting component is one which, when formed in an alloy with magnetic material(s), promotes an amorphous structure for the layer formed of the alloy. For example, a CoFeB layer, a FeB layer, a CoFeC layer and an FeC layer are examples of layers which are amorphous as-deposited. In such magnetic layers, B and C are glass-promoting components. The CoFeC layer may be a $(CoFe)_{1-x}C_x$ layer, where x is at least 0.1 and not more than 0.5. In some embodiments, x is not more than 0.4. As used herein, a CoFeC layer has the stoichiometry in the range described above. Thus, the CoFeC layer may have at least ten atomic percent and not more than fifty atomic percent C. Similarly, an FeC layer may have C in similar atomic percentages. An interstitial glass-promoting component is one which may be more likely to reside in the interstices of the "lattice" formed by the alloy. In contrast, a substitutional glass-promoting component is one which may be more likely to substitute for the magnetic component in the "lattice" formed by the alloy. B is an example of a substitutional glass-promoting component, while C is an example of an interstitial glass-promoting component. In general, an interstitial glass-promoting component diffuses through the alloy at a lower temperature than a substitutional glass-promoting component. Although described herein as "interstitial glass-promoting components" and "substitutional glass-promoting components", as used herein, an "interstitial glass-promoting component" may include any component that promotes formation of an amorphous as-deposited magnetic layer and which diffuses through the magnetic layer at an anneal temperature not exceeding four hundred and twenty-five degrees Celsius. A single interstitial glass-promoting component in the magnetic layer is described herein. However, multiple interstitial glass-promoting components may be used in other embodiments. Some or all of such glass-promoting components may be interstitial. Other magnetic material(s) and/or other interstitial glass-promoting component(s) may be used.

As part of step 102, an adsorber layer is deposited on the magnetic layer that includes the interstitial glass-promoting component. The adsorber layer has a high affinity for the interstitial glass-promoting component. In addition, the adsorber layer may have an acceptable lattice mismatch for a relevant layer. In some embodiments, the adsorber layer has a lattice mismatch of not more than ten percent with the crystalline MgO layer (e.g. the seed and/or nonmagnetic spacer layer). The crystalline MgO layer may be seen as the template layer for crystallization of the magnetic layer. Thus, the adsorber layer may also have a lattice mismatch of not more than ten percent with the magnetic layer after crystallization due to anneal(s). The lattice mismatch may be not more than five percent in some embodiments. In other embodiments, the lattice mismatch may not exceed three percent. For the CoFeC layer in the example above, Ti, Nb, Mo, Ta, W, Cr, V, Rh, Ru and Re have a high affinity for the interstitial glass-promoting component (C) and a lattice mismatch of not more than ten percent with crystalline MgO and the CoFe desired to be formed by crystallizing the magnetic layer. The adsorber layer may thus include Ti, Nb, Mo, Ta, W, Cr, V, Rh, Ru and/or Re. In some embodiments, the adsorber layer consists of a Ti layer, a Nb layer, a Mo layer, a Ta layer, a W layer, a Cr layer, a V layer, a Rh layer, a Ru layer or a Re layer. In some embodiments, only one or more of Ti, Nb, Mo, Ta, W, Cr, and V may be used. Other materials are, however, possible. In addition, it may be desirable for the adsorber layer to have a cubic structure in bulk. In such embodiments, one or more of V, Nb, Cr, Mg, Ta, W and Rh might be used. The adsorber layer provided has a thickness sufficient to act as a sink for the interstitial glass-promoting component. For example, in some embodiments, the adsorber layer is at least two Angstroms and not more than ten Angstroms thick.

One or more anneals may be performed on the magnetic and adsorber layers as part of step 102. The anneal(s) may be or include rapid thermal anneal(s) (RTA(s)). Each anneal is at a temperature of at least three hundred degrees Celsius and not exceeding four hundred and twenty-five degrees Celsius. The anneal temperature may not exceed four hundred degrees Celsius in some embodiments. As used herein, a temperature of an anneal may be considered to indicate a target temperature for the anneal. The actual temperature of the layers and the temperature of the environment surrounding the layers may deviate somewhat from the anneal temperature. The magnetic layer is at least partially crystallized after the anneal(s). Stated differently, some or all of the magnetic layer has a crystalline structure, such as body-centered cubic. The remaining portion of the magnetic layer, if any, is amorphous. Furthermore, the interstitial glass-promoting component diffuses. Because of the presence of the adsorber layer, the interstitial glass-promoting component moves toward the adsorber layer. Some or all of the interstitial glass-promoting component may diffuse into the adsorber layer during the anneal.

In some embodiments, the adsorber layer is removed after the anneal(s) as part of step 102. This may be accomplished using a plasma treatment. Although the adsorber layer may be considered removed after such a treatment, some isolated portions of the absorber layer may remain. For example, individual atoms and/or molecules of the adsorber layer may be considered part of the remaining magnetic layer. Similarly, the interstitial glass-promoting component that diffused into the adsorber layer during the anneal is removed. However, some isolated portions of the interstitial glass-promoting component may remain. For example, if the adsorber layer is Nb and the magnetic layer deposited is CoFeC, then after the plasma treatment a CoFe layer that is at least partially crystallized and may include some leftover Nb and/or C remains.

In step 102, a magnetic refill layer may also be provided. Such a magnetic refill layer may include one or more of Fe, CoFe, CoFeB, CoFeC, CoFeBTa, CoFeCTa and/or other magnetic materials. If provided after removal of the adsorber layer, such a magnetic refill layer may aid in mitigating damage caused by a plasma treatment. However, the magnetic refill layer may be provided even if the adsorber layer is not removed.

Thus, step 102 includes providing a pinned layer. As part of step 102, the magnetic layer deposition, adsorber layer deposition, anneal(s), optional adsorber layer removal and optional magnetic refill layer deposition may be carried out. These steps may form a magnetic substructure. The pinned layer provided in step 102 may be partially or fully formed by the magnetic substructure. In other embodiments, however, the pinned layer may be provided in step 102 without formation of such a magnetic substructure.

A nonmagnetic spacer layer is provided, via step 104. The nonmagnetic spacer layer formed in step 104 may adjoin the pinned layer or may be separated from the pinned layer by other layer(s) such as a PEL. In some embodiments, a crystalline MgO tunneling barrier layer may be formed. Step 104 may include depositing MgO, which forms a tunneling barrier layer. In some embodiments, step 104 may include depositing MgO using, for example, radio frequency (RF) sputtering. Metallic Mg may be deposited, then oxidized in step 104 to provide a natural oxide of Mg. The MgO barrier layer/nonmagnetic spacer layer may also be formed in another manner. Step 104 may include annealing the portion of the magnetic junction already formed to provide crystalline MgO tunneling barrier with a (100) orientation for enhanced tunneling magnetoresistance (TMR) of the magnetic junction.

A free layer is provided, via step 106. Step 106 includes depositing the material(s) for the free layer. The free layer may be deposited on seed layer(s) if the magnetic junction being formed is a top pinned magnetic junction. The seed layer(s) may be selected for various purposes including but not limited to the desired crystal structure of the free layer, magnetic anisotropy and/or magnetic damping of the free layer. For example, the free layer may be provided on a seed layer such as a crystalline MgO layer that promotes a perpendicular magnetic anisotropy in the free layer. If a dual magnetic junction or bottom pinned magnetic junction is fabricated, the free layer may be formed on a nonmagnetic spacer layer. In such embodiments, the free layer may be formed on a (100) crystalline MgO layer. Steps 102, 104 and 106 may be used to form a top or bottom pinned magnetic junction. Thus, steps 102, 104 and 106 may be performed in that order for a bottom pinned magnetic junction or in reverse order (steps 106, 104 and 102) for a top pinned magnetic junction. Alternatively, steps 106, 108 and 110 (discussed below) may be used to form a top pinned magnetic junction.

The free layer provided in step 106 may be desired to have a perpendicular magnetic anisotropy that exceeds its demagnetization energy. The magnetic moment of the free layer may thus be stable out-of-plane, including perpendicular-to-plane. In addition, a PEL may be provided as part of or in addition to the free layer. The free layer provided in step 106 is also configured to be switched between stable magnetic states when a write current is passed through the magnetic junction. Thus, the free layer is switchable utilizing spin transfer torque. The free layer provided in step 106 is magnetic and thermally stable at operating temperatures.

Formation of the free layer in step 106 may optionally include forming a magnetic substructure in a manner analogous to what is described above for the pinned layer. Thus, step 106 may include providing a magnetic layer including at least one interstitial glass-promoting component, providing an adsorber layer, one or more anneals as described above, optionally removing the adsorber layer and/or optionally depositing a magnetic refill layer. However, the thicknesses, material(s) used and/or other features may differ between the free and pinned layers. The free layer provided in step 106 may be partially or fully formed by the magnetic substructure described above. Thus, step 102 only, step 106 only, or both steps 102 and 106 may include formation of magnetic substructure(s) as described above.

An additional nonmagnetic spacer layer may optionally be provided, via step 108. Step 108 is performed if a dual magnetic junction is desired to be fabricated. If a single magnetic junction is desired, then step 108 is omitted. In some embodiments, an additional crystalline MgO tunneling barrier layer may be desired for the magnetic junction being formed. Step 108 may thus be performed as described above with respect to step 104.

An additional pinned layer may optionally be provided, via step 110. Step 110 is performed if a dual magnetic junction is desired to be fabricated. If a single magnetic junction is desired, then step 110 is omitted. In some embodiments, the perpendicular magnetic anisotropy energy exceeds the out-of-plane demagnetization energy for the pinned layer formed in step 110. Step 110 may include steps that are analogous to those performed in step 102 and 106. Thus, step 110 may include providing a magnetic layer including at least one interstitial glass-promoting component, providing an adsorber layer, performing at least one anneals as described above, optionally removing the adsorber layer and optionally providing a magnetic refill layer. The magnetic substructure described above may thus form part or all of the additional pinned layer formed in step 110. In other embodiments, step 110 may be performed in a different manner.

Fabrication of the magnetic junction may then be completed. For example, the capping layer(s) may be deposited and the edges of the magnetic junction defined, for example by providing a mask on the layers that have been deposited and ion milling the exposed portions of the layers. Additional structures, such as contacts and conductive lines may also be formed for the device in which the magnetic junction is used.

Using the method 100, a magnetic junction having high perpendicular magnetic anisotropy pinned and/or free layers may be provided. The method 100 may also provide a high magnetoresistance magnetic junction. Use of the adsorber layer(s) and interstitial glass-promoting component may allow for improved crystallization of the free layer and/or the pinned layer(s) at lower anneal temperatures. Consequently, damage to heat sensitive structures may be mitigated or avoided. Thus, the method 100 may allow a high perpendicular magnetic anisotropy and high magnetoresistance magnetic junction to be fabricated substantially without adversely affecting heat-sensitive structures.

Figure 2:
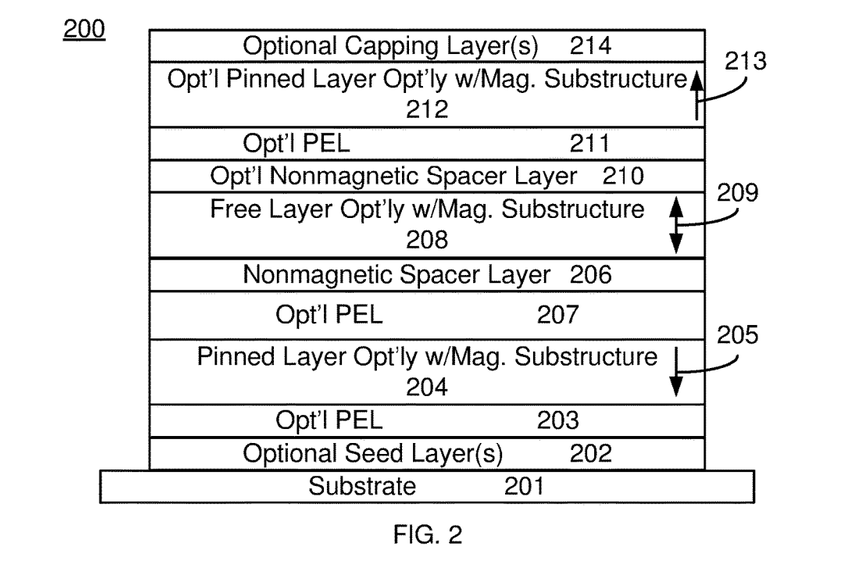
FIG. 2 depicts an exemplary embodiment of a magnetic junction usable in a magnetic memory, programmable using spin transfer torque and including a magnetic substructure having an interstitial glass-promoting component and an adsorber.

FIG. 2 depicts an exemplary embodiment of a magnetic junction 200 that may be fabricated using the method 100. For clarity, FIG. 2 is not to scale. The magnetic junction 200 may be used in a magnetic device such as a STT-RAM and, therefore, in a variety of electronic devices. The magnetic junction 200 includes optional seed layer(s) 202, optional PEL 203, a pinned layer 204 having a magnetic moment 205, another optional PEL 207, a nonmagnetic spacer layer 206, a free layer 208 having magnetic moment 209, an optional additional nonmagnetic spacer layer 210, an optional PEL 211 and an optional additional pinned layer 212 having magnetic moment 213. A bottom contact, top contact and optional capping layer(s) are not shown.

As can be seen in FIG. 2, the magnetic junction 200 is a dual magnetic junction. In another embodiment, the additional nonmagnetic spacer layer 210 and additional pinned layer 212 might be omitted. If the pinned layer 204 is closest to the substrate in such a case, then the magnetic junction 200 is a bottom pinned magnetic junction. Alternatively, the free layer 208 could be closer to the substrate than the pinned layer 204. In such an embodiment, the magnetic junction 200 is a top pinned magnetic junction. Also in this embodiment, the free layer 208 may adjoin the seed layer(s) 202. In another embodiment, a top pinned magnetic junction may include layers 208, 210 and 212. In such an embodiment, layers 203, 204, 207 and 206 may be omitted. Optional pinning layer(s) (not shown) may be used to fix the magnetization of the pinned layer(s) 204 and/or 212. In some embodiments, the optional pinning layer may be an AFM layer or multilayer that pins the magnetization(s) 205 and/or 213 by an exchange-bias interaction. However, in other embodiments, the optional pinning layer may be omitted or another structure may be used.

The nonmagnetic spacer layer(s) 206 and 210 may be tunneling barrier layers. For example, the nonmagnetic spacer layer 206 and/or 210 may be a crystalline MgO tunneling barrier with a (100) orientation. Such nonmagnetic spacer layers 206 and 210 may enhance TMR of the magnetic junction 200. The nonmagnetic spacer layer(s) 206 and 210 may also be considered to serve as seed and capping layers for the free layer 208.

In the embodiment shown in FIG. 2, the perpendicular magnetic anisotropy energies of the pinned layers 204 and 212 and of the free layer 208 each exceeds the out of plane demagnetization energies of the pinned layers 204 and 212 and free layer 208, respectively. Consequently, the magnetic moments 205, 209 and 213 of the pinned layer 204, the free layer 208 and the pinned layer 212, respectively, may be perpendicular to plane. Stated differently, the stable magnetic states for the free layer 209 may be with the moment oriented in the +z direction or the −z direction.

The magnetic junction 200 is also configured to allow the free layer 208 to be switched between stable magnetic states when a write current is passed through the magnetic junction 200. Thus, the free layer 208 is switchable utilizing spin transfer torque when a write current is driven through the magnetic junction 200 in a current perpendicular-to-plane (CPP) direction. The data stored in the magnetic junction 200, and thus the direction of magnetization of the free layer 208, may be read by driving a read current through the magnetic junction 200. The read current may also be driven through the magnetic junction 200 in the CPP direction. Thus, the magnetoresistance of the magnetic junction 200 provides the read signal.

The magnetic junction 200 may have improved performance due to fabrication using the step(s) 102, 106 and/or 110. Because at least one of the layers 204, 208 and 212 is formed in the manner described above, at least one of the layers 204, 208 and 212 includes a magnetic substructure. In some embodiments one or more of the optional PELs 203, 207 and/or 211 may include a magnetic substructure formed as described above. This magnetic substructure has at least one of interstitial glass-promoting component(s) and adsorber(s). For example, if the magnetic junction 200 is a bottom pinned magnetic junction and omits the layers 211 and 212, then at least one of the pinned layer 204 and/or the free layer 208 has a magnetic substructure including the interstitial glass-promoting component(s) and/or the adsorber(s). If the magnetic junction 200 is a top pinned magnetic junction and omits the layers 204 and 206, then at least one of the pinned layer 212 and/or the free layer 208 has a magnetic substructure including the interstitial glass-promoting component(s) and/or the adsorber(s).

Use of the adsorber layer(s) and interstitial glass-promoting component may allow for improved crystallization of the free layer 208 and/or the pinned layer(s) 204 and/or 212 at lower temperatures. Further, the magnetic layers 208, 204 and/or 212 may have a high perpendicular magnetic anisotropy. The magnetic junction 200 may also have a higher magnetoresistance. Performance may thus be improved. Because a lower anneal temperature is used, structure(s) which may be damaged or destroyed by higher anneal temperatures, for examples temperatures of five hundred degrees Celsius, may be preserved. Thus, the method 100 allows the benefits of the magnetic junction 200 to be enjoyed without adversely affecting heat-sensitive structures.

Figure 3:
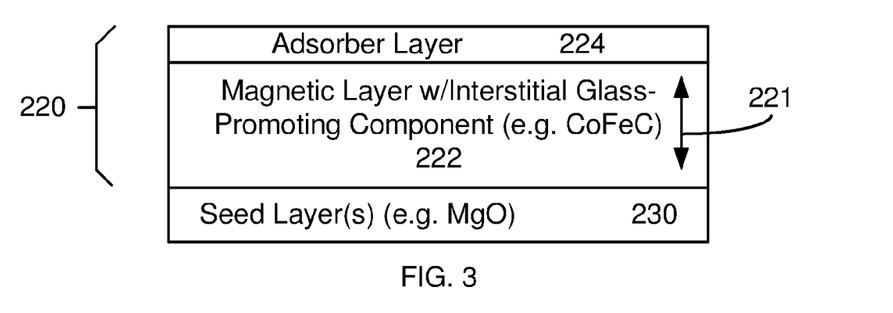
FIG. 3 depicts an exemplary embodiment of a magnetic substructure usable in a magnetic junction and having an interstitial glass-promoting component and an adsorber.

FIG. 3 depicts an exemplary embodiment of a magnetic substructure 220 usable in a magnetic junction such as the magnetic junction 200. For clarity, FIG. 3 is not to scale. The magnetic junction 200 in which the magnetic substructure 220 is used may be used in a variety of applications. For example, the magnetic junction 200, and thus the magnetic substructure, may be used in a magnetic memory such as an STT-MRAM. At least one of the magnetic layers 204, 208 and 212 of the magnetic junction 200 may include or consist of the magnetic substructure 220. The magnetic substructure 220 is shown as residing on seed layer(s) 230. The seed layer(s) 230 may be or include a crystalline MgO layer. For example, if the magnetic substructure 220 is used in the free layer 208 or the pinned layer 212, the seed layer 230 may include the nonmagnetic spacer layer 206 or the additional nonmagnetic spacer layer 210, respectively. If the magnetic substructure 220 is used in the pinned layer 204, then the seed layer(s) 230 may include the seed layer(s) 202. Such seed layer(s) 230/202 may include crystalline MgO. However, the seed layer(s) 230 are not considered part of the magnetic substructure 220.

The magnetic substructure 220 includes a magnetic layer 222 and an adsorber layer 224. The magnetic layer 222 includes an interstitial glass-promoting component, such as C. Consequently, the magnetic layer 222 is amorphous as-deposited. For example, the magnetic layer 222 may be a CoFeC layer as deposited. The magnetic layer 222 may also have a perpendicular magnetic anisotropy energy that is greater than the out-of-plane demagnetization energy. Consequently, the magnetic moment 221 of the magnetic layer 222 may be perpendicular-to-plane. In some embodiments, the magnetic layer 222 is at least one nanometer thick and not more than four nanometers thick.

The adsorber layer 224 has a high affinity for the interstitial glass-promoting component and has a lattice mismatch with at least part of the seed layer(s) 230 of not more than ten percent. In some embodiments, the lattice mismatch is not more than five percent. In some such embodiments, the lattice mismatch is not more than three percent. The adsorber layer 224 may include one or more of Ti, Nb, Mo, Ta, W, Cr, V, Rh, Ru and Re. In some such embodiments, the adsorber layer 224 may include Ti, Nb, Mo, Ta, W, Cr and/or V. In some embodiments, the adsorber layer 224 may have a cubic crystal structure when formed in bulk. For example, V, Nb, Cr, Mo, Ta and W may be used in the adsorber layer 224 if a cubic structure is desired. The adsorber layer 224 is sufficiently thick to allow some or all of the interstitial glass-promoting component to diffuse into the adsorber layer 224 during an anneal having an anneal temperature of at least three hundred degrees Celsius and not more than four hundred or four hundred and twenty-five degrees Celsius. For example, the adsorber layer 224 may be at least two Angstroms thick and not more than ten Angstroms thick. The adsorber layer 224 is also desired to have a low diffusion through the magnetic junction in which the magnetic substructure 220 resides.

The magnetic substructure 220 has also undergone an anneal described above for the method 100. The anneal may be an RTA and is at an anneal temperature that does not exceed four hundred and twenty-five degrees Celsius. In some embodiments, the anneal temperature does not exceed four hundred degrees Celsius. Thus, although the magnetic layer 222 is described as including the interstitial glass-promoting component, some or all of the glass-promoting component may have diffused out of the magnetic layer 222 and into the adsorber layer 224. The magnetic layer 222 may thus be at least partially crystallized. For example, if the magnetic layer 222 includes CoFeC as-deposited, then some or all of the C may have diffused into the adsorber layer 224. The remaining portion of the magnetic layer 222 may have crystallized into CoFe.

Because of the presence of the absorber layer 224, the interstitial glass-promoting component diffuses towards the adsorber layer 224 during the anneal(s), rather than toward the seed layer(s) 230. Without the adsorber layer 224, the interstitial glass-promoting component diffuses toward the interface with the seed layer(s) 230. Such diffusion may adversely affect perpendicular magnetic anisotropy and/or magnetoresistance. Use of the adsorber layer causes the interstitial glass-promoting component to diffuse toward the adsorber layer 224. Thus, issues due to diffusion of the interstitial glass promoting component toward the seed layer(s) 230 may be mitigated or eliminated by the use of the adsorber layer 224.

A magnetic junction including the magnetic substructure 220 may have improved performance. The magnetic substructure 220 includes interstitial glass-promoting component(s) and adsorber(s). The magnetic layer 222 may have a high perpendicular magnetic anisotropy because of the crystallization of the magnetic layer 222. The magnetic substructure 220 may result in the magnetic junction having enhanced magnetoresistance due to the crystallization of the magnetic layer 222. This may be achieved without adversely affecting magnetoresistance and perpendicular magnetic anisotropy because the interstitial glass-promoting component is attracted to the adsorber layer 224 rather than to the seed layer(s) 230 such as MgO. A magnetic junction utilizing the magnetic substructure may have a higher magnetoresistance and/or improved switching characteristics. Damage to heat sensitive structures may also be reduced or eliminated because lower anneal temperatures may be used. Performance and fabrication may thus be improved.

Figure 4:
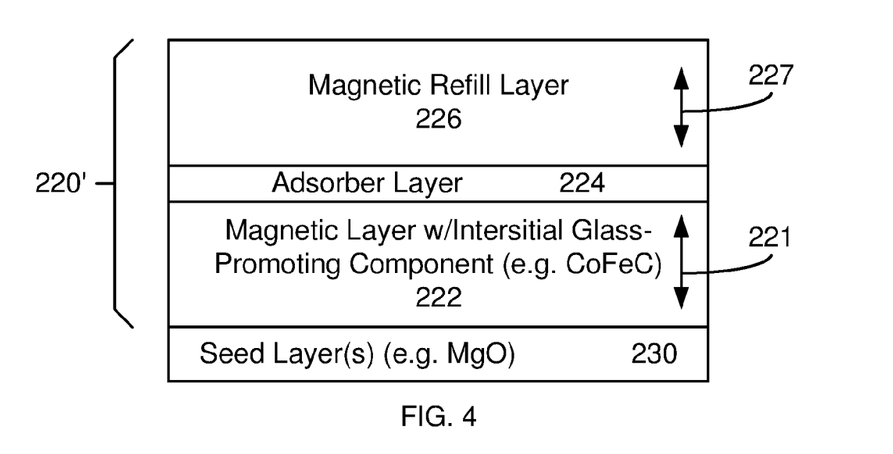
FIG. 4 depicts another exemplary embodiment of a magnetic substructure usable in a magnetic junction and having an interstitial glass-promoting component and an adsorber.

FIG. 4 depicts an exemplary embodiment of a magnetic substructure 220' usable in a magnetic junction such as the magnetic junction 200, another MTJ, spin valve, or ballistic magnetoresistance structure, or some combination thereof. For clarity, FIG. 4 is not to scale. The magnetic substructure 220' is analogous to the magnetic substructure 220. Consequently, similar components have analogous labels. The magnetic substructure 220' is shown as residing on seed layer(s) 230 that are analogous to the seed layer(s) 230 depicted in FIG. 3. Such seed layer(s) 230/202 may include crystalline MgO. However, the seed layer(s) 230 is not considered part of the magnetic substructure 220'.

The magnetic substructure 220' includes a magnetic layer 222 and an adsorber layer 224 that are analogous to the magnetic layer 222 and absorber layer 224 of the magnetic substructure 220. In addition, the magnetic substructure 220' includes a magnetic refill layer 226 having a magnetic moment 227 that may be perpendicular-to-plane. For example, the magnetic refill layer 226 may include one or more of Fe, CoFe, CoFeB, CoFeC, CoFeBTa an d/or CoFeCTa. In some embodiments, the magnetic refill layer 226 is at least one nanometer thick and not more than four nanometers thick.

The magnetic substructure 220' has also undergone an anneal described above for the method 100. Thus, some or all of the glass-promoting component may have diffused out of the magnetic layer 222 and into the adsorber layer 224. The magnetic layer 222 may thus be at least partially crystallized. Because of the presence of the absorber layer 224, the interstitial glass-promoting component diffuses towards the adsorber layer 224 rather than toward the seed layer(s) 230.

A magnetic junction including the magnetic substructure 220' may have improved performance. The magnetic substructure 220' includes interstitial glass-promoting component(s) and adsorber(s). As deposited, the magnetic layer 222 includes the interstitial glass-promoting component(s). After the anneal, some or all of the interstitial glass-promoting component(s) have diffused to the adsorber layer 224. Use of the adsorber layer 224 and interstitial glass-promoting component may allow for improved crystallization of the magnetic layer 222 at lower temperatures. The magnetic layer 222 may have a high perpendicular magnetic anisotropy. The magnetic substructure may have enhanced magnetoresistance due to the crystallization. This may be achieved without adversely affecting magnetoresistance and perpendicular magnetic anisotropy because the interstitial glass-promoting component is attracted to the adsorber layer 224. The magnetic junction utilizing the magnetic substructure may have a higher magnetoresistance and/or improved switching characteristics. Damage to heat sensitive structures may also be reduced or eliminated because lower anneal temperatures may be used. Performance and fabrication may thus be improved.

Figure 5:
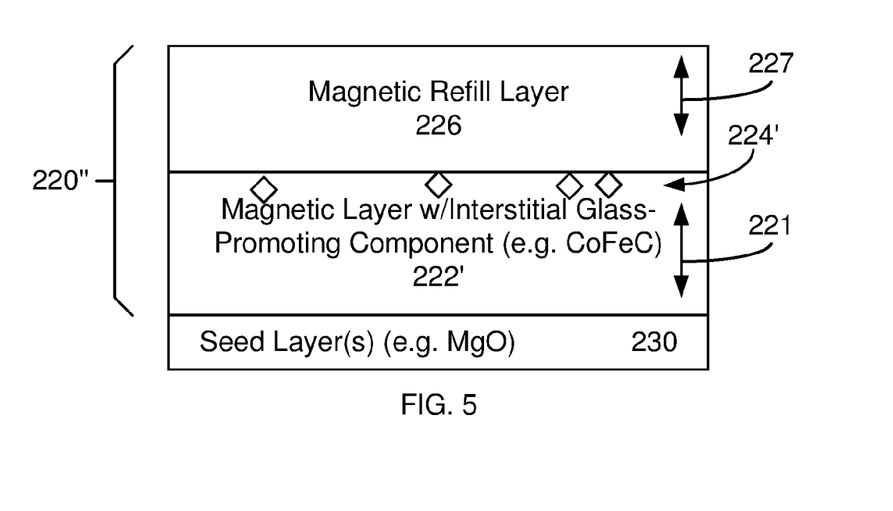
FIG. 5 depicts another exemplary embodiment of a magnetic substructure usable in a magnetic junction and having an interstitial glass-promoting component and an adsorber.

FIG. 5 depicts an exemplary embodiment of a magnetic substructure 220'' usable in a magnetic junction such as the magnetic junction 200, another MTJ, spin valve, or ballistic magnetoresistance structure, or some combination thereof. For clarity, FIG. 5 is not to scale. The magnetic substructure 220'' is analogous to the magnetic substructure 220. Consequently, similar components have analogous labels. The magnetic substructure 220'' is shown as residing on seed layer(s) 230 that are analogous to the seed layer(s) 230 depicted in FIG. 3. Such seed layer(s) 230/202 may include crystalline MgO. However, the seed layer(s) 230 is not considered part of the magnetic substructure 220".

The magnetic substructure 220" includes a magnetic layer 222' and a magnetic refill layer 226 that are analogous to the magnetic layer 222 and magnetic refill layer 226 of the magnetic substructure(s) 220 and//or 220'. The magnetic substructure 220" has also undergone an anneal described above for the method 100. Thus, some or all of the glass-promoting component may have diffused out of the magnetic layer 222' and into the adsorber layer (not shown). The magnetic layer 222' may thus be at least partially crystallized. Because of the presence of the absorber layer, the interstitial glass-promoting component diffuses towards the adsorber layer rather than the seed layer(s) 230. Thus, the diffusion of interstitial glass-promoting component may adversely affect performance by moving toward the interface with the seed layer(s) 230.

In addition, the adsorber layer has been removed prior to deposition of the magnetic refill layer 226. For example, a plasma treatment may be performed prior to deposition of the magnetic refill layer 226. However, some of the adsorber 224' and/or some of the interstitial glass-promoting component (not separately depicted in FIG. 5) remains. The adsorber 224' is shown as diamonds located near the interface of the magnetic layer 222'. In this embodiment, the magnetic refill layer 226 may aid in mitigating the damage to the magnetic layer 222' caused by the removal of the adsorber layer.

A magnetic junction including the magnetic substructure 220" may have improved performance. The magnetic substructure 220" includes interstitial glass-promoting component(s) and adsorber(s). Use of the adsorber layer, of which adsorber 224' remains, and interstitial glass-promoting component may allow for improved crystallization of the magnetic layer 222 at lower temperatures. The magnetic layer 222 may have a high perpendicular magnetic anisotropy and enhanced magnetoresistance. This may be achieved without adversely affecting magnetoresistance and perpendicular magnetic anisotropy because the interstitial glass-promoting component is attracted to the adsorber layer. The magnetic junction utilizing the magnetic substructure may have a higher magnetoresistance and/or improved switching characteristics. Damage to heat sensitive structures may also be reduced or eliminated because lower anneal temperatures may be used. Performance and fabrication may thus be improved.

Figure 6:
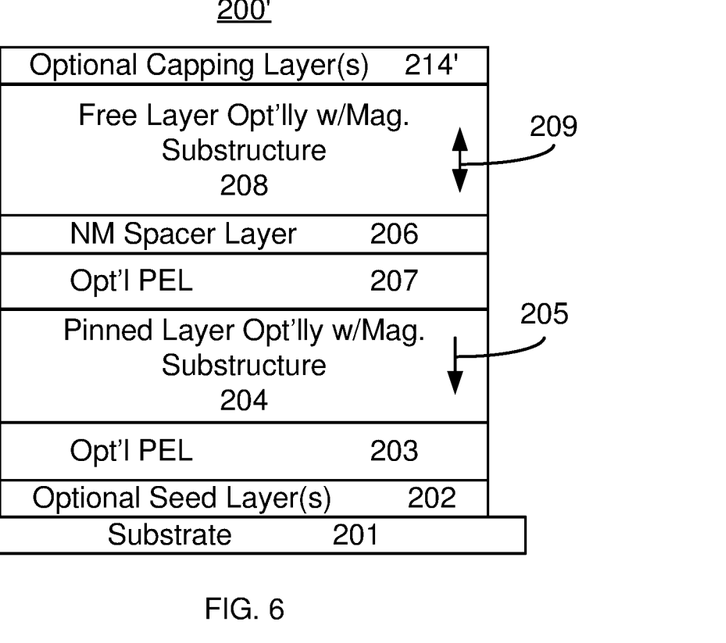
FIG. 6 depicts another exemplary embodiment of a magnetic junction usable in a magnetic memory, programmable using spin transfer torque and including a magnetic substructure having an interstitial glass-promoting component and an adsorber.

FIG. 6 depicts another exemplary embodiment of a magnetic junction 200' in a magnetic devices such as a magnetic memory programmable using spin transfer torque. For clarity, FIG. 6 is not to scale. The magnetic junction 200' is analogous to the magnetic junction 200. Consequently, similar components have analogous labels. The magnetic junction 200' is a bottom pinned magnetic junction including optional polarization enhancement layer 203, pinned layer 204, optional polarization enhancement layer 207, nonmagnetic spacer layer 206 and free layer 208 that are analogous to the optional polarization enhancement layer 203, pinned layer 204, optional polarization enhancement layer 207, nonmagnetic spacer layer 206 and free layer 208, respectively. Optional seed layer 202 and capping layer 214' are also shown.

At least one of the pinned layer 204 and the free layer 208 includes the magnetic substructure 220, 220' and/or 220". In some embodiments, only one of the pinned layer 204 and the free layer 208 includes the magnetic substructure 220, 220' and/or 220". In other embodiments, both the pinned layer 204 and the free layer 208 includes the magnetic substructure 220, 220' and/or 220". In some embodiments, the layer(s) 204 and/or 208 consists of the magnetic substructure 220, 220' and/or 220". In other embodiments, the layer(s) 204 and/or 208 may include other layers. For example, the layer 204 and/or 208 may be a SAF. In some cases, the optional PEL(s) 203 and/or 207 may include the magnetic substructure 220, 220' and/or 220".

The magnetic junction 200' may have improved performance for the reasons described above. Because of the use of the interstitial glass-promoting component and the adsorber, the layer(s) 204 and/or 208 may be crystallized at a lower temperature. Thus, magnetoresistance and/or perpendicular magnetic anisotropy may be improved despite the use of a lower anneal temperature. Because a lower anneal temperature is used, damage to heat sensitive structure(s) may be reduced or avoided.

Figure 7:
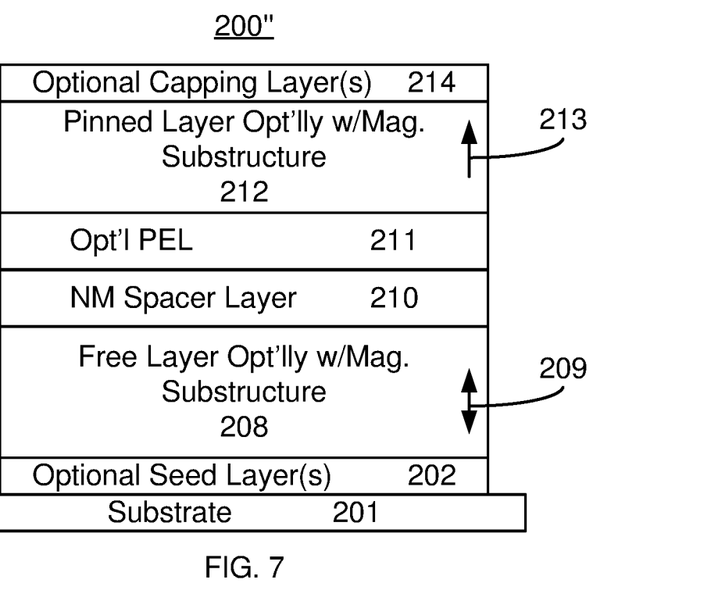
FIG. 7 depicts another exemplary embodiment of a magnetic junction usable in a magnetic memory, programmable using spin transfer torque and including a magnetic substructure having an interstitial glass-promoting component and an adsorber.

FIG. 7 depicts another exemplary embodiment of a magnetic junction 200" in a magnetic devices such as a magnetic memory programmable using spin transfer torque. For clarity, FIG. 7 is not to scale. The magnetic junction 200" is analogous to the magnetic junction(s) 200 and/or 200'. Consequently, similar components have analogous labels. The magnetic junction 200" is a top pinned magnetic junction including free layer 208, nonmagnetic spacer layer 210, optional polarization enhancement layer 211 and pinned layer 212 that are analogous to the free layer 208, nonmagnetic spacer layer 210, optional polarization enhancement layer 211 and pinned layer 212, respectively. Optional seed layer 202 and capping layer 214 are also shown.

At least one of the free layer 208 and pinned layer 212 includes the magnetic substructure 220, 220' and/or 220". In some embodiments, only one of the free layer 208 and pinned layer 212 includes the magnetic substructure 220, 220' and/or 220". In other embodiments, both the free layer 208 and the pinned layer 212 includes the magnetic substructure 220, 220' and/or 220". In some embodiments, the layer(s) 208 and/or 212 consists of the magnetic substructure 220, 220' and/or 220". In other embodiments, the layer(s) 208 and/or 212 may include other layers. For example, the layer 208 and/or 212 may be a SAF. In some cases, the optional PEL 211 may include the magnetic substructure 220, 220' and/or 220".

The magnetic junction 200" may have improved performance for the reasons described above. Because of the use of the interstitial glass-promoting component and the adsorber, the layer(s) 208 and/or 212 may be crystallized at a lower temperature. Thus, magnetoresistance and/or perpendicular magnetic anisotropy may be improved despite the use of a lower anneal temperature. Because a lower anneal temperature is used, damage to heat sensitive structure(s) may be reduced or avoided.

Figure 8:
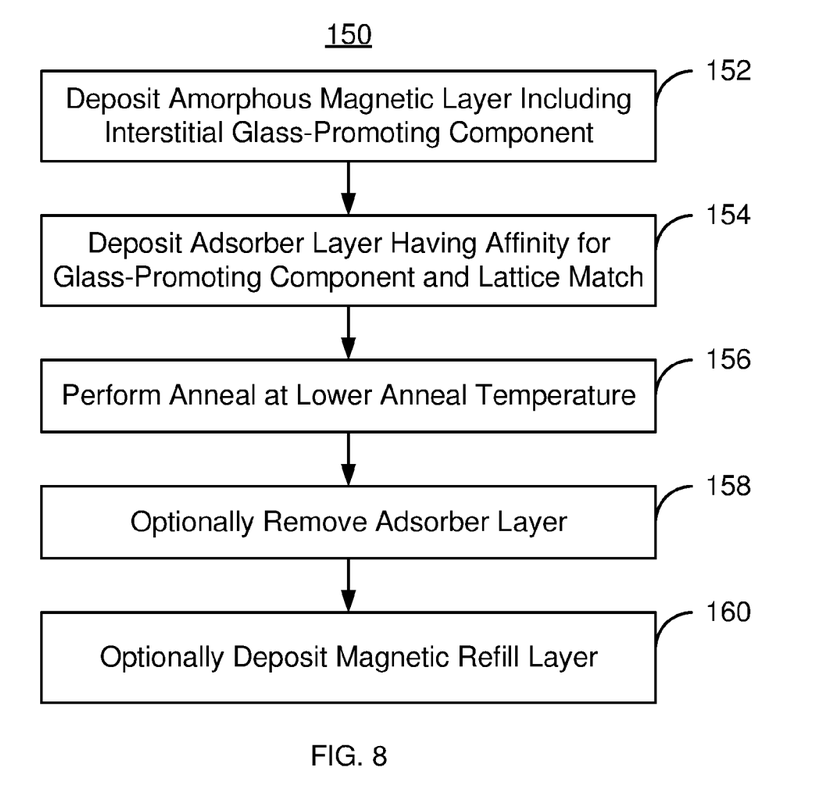
FIG. 8 is a flow chart depicting an exemplary embodiment of a method for providing a magnetic substructure including at least one interstitial glass-promoting layer and at least one adsorber.

FIG. 8 is a flow chart depicting an exemplary embodiment of a method 150 for providing a magnetic substructure for magnetic junction usable in a magnetic device and including at least one interstitial glass-promoting layer and at least one adsorber. For simplicity, some steps may be omitted, performed in another order, include substeps and/or combined. Further, the method 150 start after other steps in forming a magnetic memory have been performed. FIGS. 9-13 depict exemplary embodiments of magnetic substructures 250 and 250' usable in a magnetic junction and having an interstitial glass-promoting component and an adsorber during fabrication. However the method 150 may be used in forming other magnetic substructures such as the magnetic substructures 220, 220' and/or 220". Further, multiple magnetic junctions may be simultaneously fabricated.

A magnetic layer including at least one interstitial glass-promoting component is deposited, via step 152. The magnetic layer is amorphous as-deposited. Examples of such layers include a CoFeC layer and an FeC layer.

Figure 9:
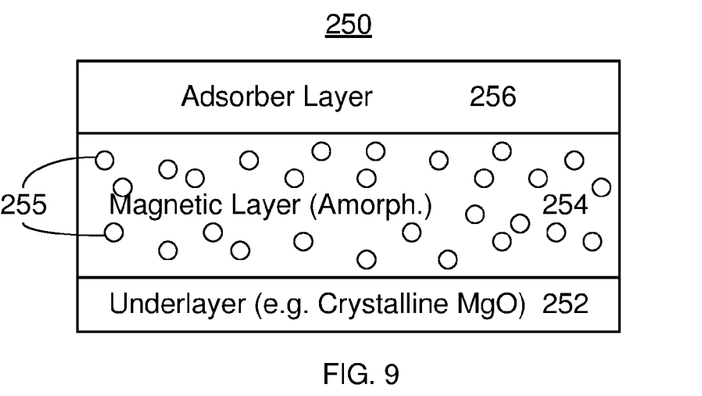
FIGS. 9-13 depict exemplary embodiments of a magnetic substructure usable in a magnetic junction and having an interstitial glass-promoting component and an adsorber during fabrication.

An adsorber layer is deposited on the magnetic layer, via step 154. The adsorber layer has a high affinity for the interstitial glass-promoting component and an acceptable lattice mismatch for a relevant layer. FIG. 9 depicts the magnetic substructure 250 after step 154 is performed. Thus, a magnetic layer 254 and an adsorber layer 256 are shown. The magnetic layer 254 is shown on an underlayer 252. The underlayer 252 may include a seed layer such as crystalline MgO, a nonmagnetic spacer layer such as a crystalline MgO layer, and/or a PEL layer. The underlayer 252 is not considered part of the magnetic substructure 250. The magnetic layer 254 is amorphous as deposited and includes interstitial glass-promoting component 255, which are shown as circles. For clarity, only two of the atoms/molecules of the glass-promoting component 255 are "numbered". Although a particular number of atoms/molecules of the interstitial glass-promoting component 255 are shown, another number may be present. The interstitial glass-promoting component 255 is distributed throughout the magnetic layer 254. In some embodiments, the interstitial glass-promoting component 255 consists of C. In other embodiments, additional interstitial glass-promoting component(s) and/or different interstitial glass-promoting component(s) may be used. In some embodiments, substitutional glass-promoting components might also be included in the magnetic layer 254.

The adsorber layer 256 has a high affinity for the interstitial glass-promoting component 255. The adsorber layer may also match the lattice of the underlayer 252 and thus the magnetic layer 254. In some embodiments, the adsorber layer has a lattice mismatch of not more than ten percent with a crystalline MgO layer (e.g. underlayer 252/nonmagnetic spacer layer). The lattice mismatch not exceed five percent in some embodiments. In other embodiments, the lattice mismatch does not exceed three percent. The adsorber layer 256 may include one or more of Ti, Nb, Mo, Ta, W, Cr, V, Rh, Ru and Re, which have a high affinity for the interstitial glass-promoting component carbon and a lattice mismatch of not more than ten percent with crystalline MgO. In some embodiments, the adsorber layer 256 is selected from a Ti layer, a Nb layer, a Mo layer, a Ta layer, a W layer, a Cr layer, a V layer, a Rh layer, a Ru layer or a Re layer. In some embodiments, only one or more of Ti, Nb, Mo, Ta, W, Cr, and V may be used. Other materials are, however, possible. In addition, it may be desirable for the adsorber layer 256 to have a bulk cubic structure. In such embodiments, the material for the adsorber layer 256 may be selected from V, Nb, Cr, Mg, Ta, W and Rh. The adsorber layer 256 may have a thickness of at least two Angstroms and not more than ten Angstroms.

Figure 10:
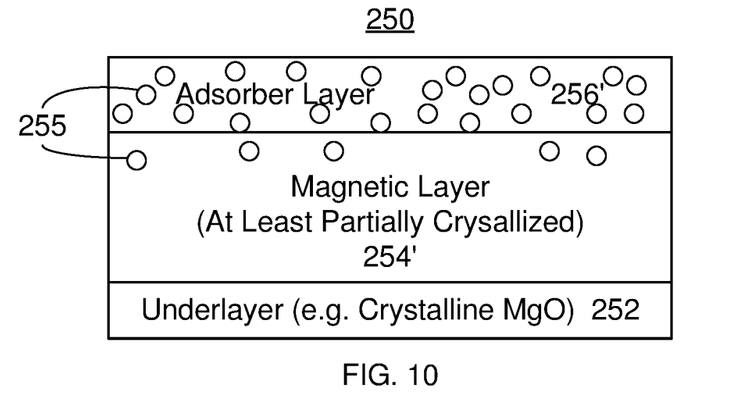

One or more anneals may be performed on the magnetic layer 254 and the adsorber layer 256, via step 156. Step 156 may include performing an anneal at a temperature of not less than three hundred degrees Celsius and not more than four hundred and twenty-five degrees Celsius. In some embodiments, the anneal temperature does not exceed four hundred degrees Celsius. FIG. 10 depicts the magnetic substructure 250 after step 156 is performed. The magnetic layer 254' is at least partially crystallized after the anneal(s). Some or all of the magnetic layer 254' has a crystalline structure, such as body-centered cubic. The interstitial glass-promoting component 255 has diffused. Because of the presence of the adsorber layer 256', the interstitial glass-promoting component 255 moves toward the adsorber layer 256'. Some or all of the interstitial glass-promoting component may diffuse into the adsorber layer 256 during the anneal. Thus, FIG. 10 depicts adsorber layer 256' that includes the adsorber and diffused interstitial glass-promoting component 255. The portion of the magnetic layer 254' near the interface with the underlayer 252 may be devoid of interstitial glass-promoting component 255. In some embodiments, fabrication of the magnetic substructure 250 terminates after step 156.

Figure 11:
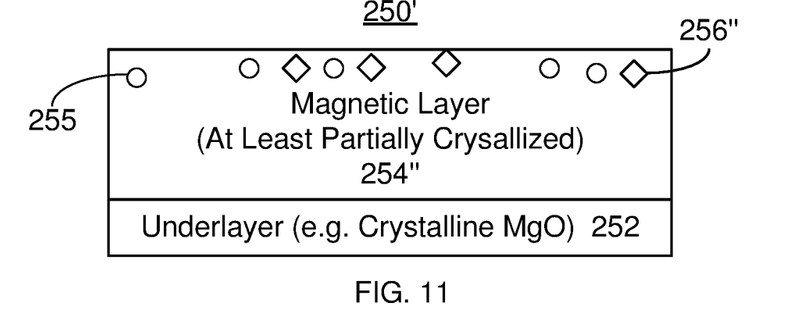

The adsorber layer 256' may optionally be removed after the anneal(s), via step 158. Step 158 may be performed using a plasma treatment. Alternatively, the adsorber layer 256' may simply remain in place or only a portion of the adsorber layer 256' may be removed. Although the adsorber layer may be considered removed after such a treatment, some isolated portions of the adsorber layer 256' may remain. FIG. 11 depicts a magnetic substructure 250' in which step 158 is implemented. Thus, no adsorber layer remains. However, isolated portions of the adsorber 256" from the adsorber layer remain in or on the magnetic layer 254". For example, the diamonds may represent atoms and/or molecules of the adsorber used in the adsorber layer 256'. In addition, only some atoms/molecules of the interstitial glass-promoting component 255 remains in the magnetic layer 254".

Figure 12:
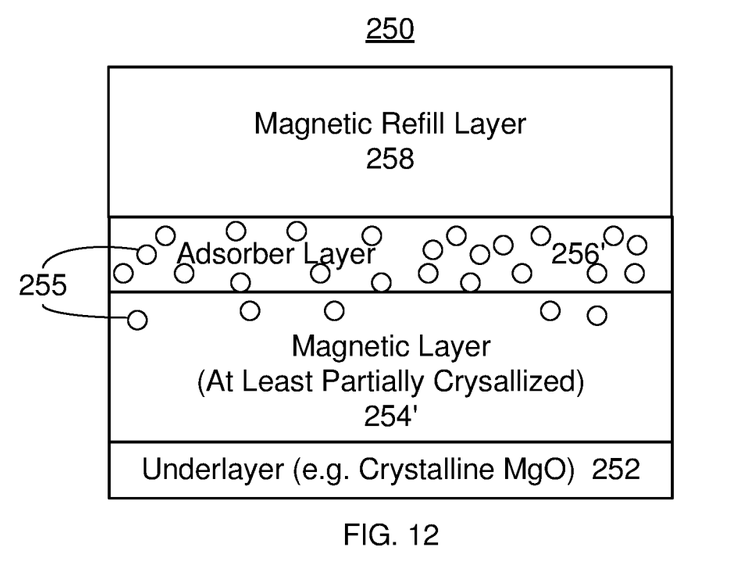
Figure 13:
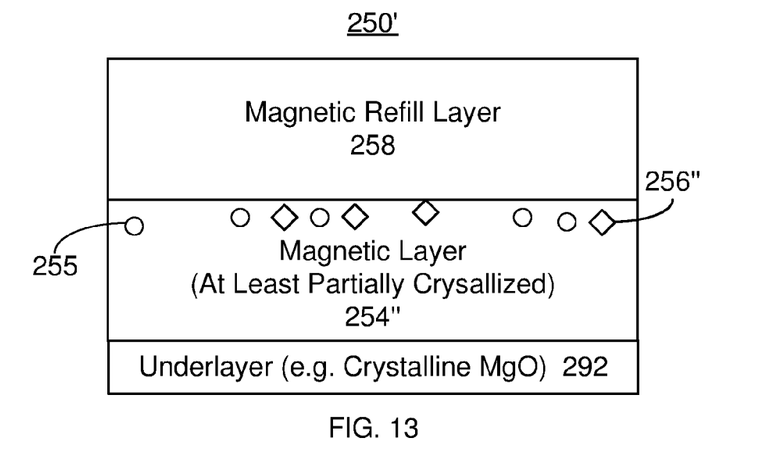

A magnetic refill layer may also be provided, via step 160. Step 160 may be performed whether or not step 158 is carried out. Such a magnetic refill layer may include one or more of Fe, CoFe, CoFeB, CoFeC, CoFeBTa, CoFeCTa and/or other magnetic materials. FIG. 12 depicts the magnetic substructure 250 in which the magnetic refill layer 250 has been provided on the adsorber layer 256'. Thus, the magnetic substructure 250 depicted in FIG. 12 is one for which the adsorber layer 256' is not removed. In contrast, FIG. 13 depicts the magnetic substructure 250' in which the magnetic refill layer 258 has been provided after the adsorber layer 256' has been removed. Thus, the magnetic refill layer 258 may aid in mitigating damage caused by a plasma treatment.

Using the method 150, magnetic substructures 250 and/or 250' may be formed. A magnetic junction, such as the magnetic junction(s) 200, 200' and/or 200" may have improved performance for the reasons described above. Because of the use of the interstitial glass-promoting component and the adsorber, the magnetic layer 254 may be crystallized at a lower temperature. Thus, magnetoresistance and/or perpendicular magnetic anisotropy may be improved despite the use of a lower anneal temperature. Because a lower anneal temperature is used, damage to heat sensitive structure(s) may be reduced or avoided.

Various features have been described with respect to the magnetic junctions 200, 200' and 200" and the magnetic substructures 220, 220', 220", 250 and/or 250'. One of ordinary skill in the art will recognize that these features may be combined in manner(s) not shown and which are not inconsistent with the devices and methods described herein.

Figure 14:
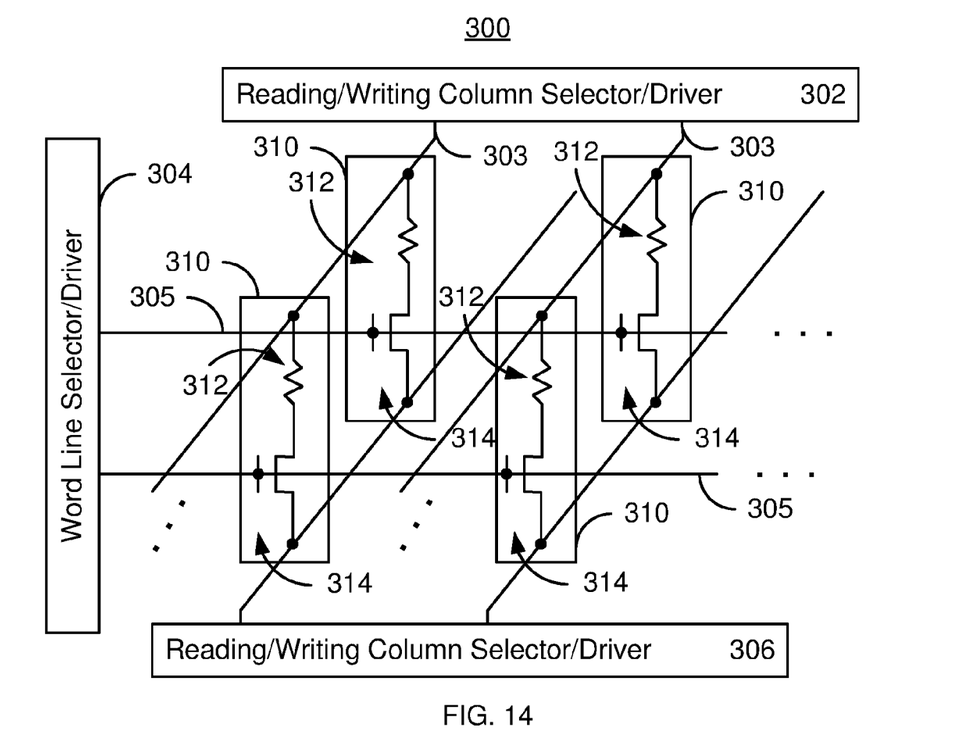
FIG. 14 depicts an exemplary embodiment of a memory utilizing magnetic junctions in the memory element(s) of the storage cell(s).

FIG. 14 depicts an exemplary embodiment of a memory 300 that may use one or more of the magnetic junctions 200, 200' and/or 200" and/or other magnetic junction including a magnetic substructure such as the magnetic substructure layer 220' and/or 220". The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the 200, 200', 200" and/or other magnetic junction including the magnetic substructure such as the magnetic substructure 220, 220' and/or 220". Although one magnetic junction 312 is shown per cell 310, in other embodiments, another number of magnetic junctions 312 may be provided per cell. As such, the magnetic memory 300 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a magnetic junction usable in a magnetic device, the method comprising:
providing a free layer, the free layer being switchable between a plurality of stable magnetic states using a write current passed through the magnetic junction;
providing a nonmagnetic spacer layer;
providing a pinned layer, the nonmagnetic spacer layer residing between the pinned layer and the free layer; and
wherein at least one of the step of providing the free layer and the step of providing the pinned layer includes
depositing a magnetic layer including an interstitial glass-promoting component, the magnetic layer being amorphous as-deposited;
depositing an adsorber layer on the magnetic layer, the adsorber layer attracting the interstitial glass-promoting component and having a lattice mismatch with the nonmagnetic spacer layer of not more than ten percent;
and
performing at least one anneal of the magnetic layer and the adsorber layer, each of the at least one anneal having an anneal temperature greater than 300 degrees Celsius and not more than 425 degrees Celsius;
wherein the at least one of the step of providing the free layer and the step of providing the pinned layer further includes:
removing the adsorber layer after the at least one anneal is performed and
such that a portion of the magnetic layer is exposed; and
optionally depositing a magnetic refill layer after the step of removing the adsorber layer.

2. The method of claim 1 wherein the step of removing the adsorber layer further includes:
performing a plasma treatment.

3. The method of claim 1 wherein the interstitial glass-promoting component includes C.

4. The method of claim 3 wherein the interstitial glass-promoting component consists of C.

5. The method of claim 4 wherein the adsorber layer includes at least one of Ti, Nb, Mo, Ta, W, Cr, V, Rh, Ru and Re.

6. The method of claim 4 wherein the adsorber layer is at least two Angstroms thick and not more than ten Angstroms thick.

7. The method of claim 1 wherein the adsorber layer has a cubic crystal structure.

8. The method of claim 1 wherein the lattice mismatch is not more than five percent.

9. The method of claim 1 further comprising:
providing an additional nonmagnetic spacer layer, the free layer being between the additional nonmagnetic spacer layer and the nonmagnetic spacer layer; and
providing an additional pinned layer, the additional nonmagnetic spacer layer being between the additional pinned layer and the free layer.

10. The method of claim 1 wherein the adsorber layer does not share an interface with the nonmagnetic spacer layer, has the lattice mismatch of not more than three percent and excludes Ta.

11. A method for providing a magnetic junction usable in a magnetic device, the method comprising:
providing a free layer, the free layer being switchable between a plurality of stable magnetic states using a write current passed through the magnetic junction;
providing a nonmagnetic spacer layer;
providing a pinned layer, the nonmagnetic spacer layer residing between the pinned layer and the free layer, wherein at least one of the step of providing the free layer and the step of providing the pinned layer includes
depositing a magnetic layer including an interstitial glass-promoting component, the magnetic layer being amorphous as-deposited;
depositing an adsorber layer on the magnetic layer, the adsorber layer attracting the interstitial glass-promoting component and having a lattice mismatch with the nonmagnetic spacer layer of not more than ten percent;
and
performing at least one anneal of the magnetic layer and the adsorber layer, each of the at least one anneal having an anneal temperature greater than 300 degrees Celsius and not more than 425 degrees Celsius
providing an additional nonmagnetic spacer layer, the free layer being between the additional nonmagnetic spacer layer and the nonmagnetic spacer layer; and
providing an additional pinned layer, the additional nonmagnetic spacer layer being between the additional pinned layer and the free layer, wherein the step of providing the additional pinned layer further includes
depositing an additional magnetic layer including an additional interstitial glass-promoting component, the additional magnetic layer being amorphous as-deposited;
depositing an additional adsorber layer on the additional magnetic layer, the additional adsorber layer including at least one of Ti, Nb, Mo, Ta, W, Cr and V;
performing at least one additional anneal of the additional magnetic layer and the additional adsorber layer at an additional anneal temperature greater than 300 degrees Celsius and not more than 425 degrees Celsius;
optionally removing the additional adsorber layer; and
optionally depositing an additional magnetic refill layer.

12. A method for providing a magnetic junction usable in a magnetic device, the method comprising:
providing a free layer, the free layer being switchable between a plurality of stable magnetic states using a write current passed through the magnetic junction;
providing a crystalline MgO tunneling barrier layer;

providing a pinned layer, the crystalline MgO tunneling layer residing between the pinned layer and the free layer; and wherein at least one of the step of providing the free layer and the step of providing the pinned layer includes providing a magnetic substructure, the step of providing a magnetic substructure including depositing a magnetic layer, the magnetic layer including C as an interstitial glass-promoting component, being amorphous as-deposited and including FeC;

depositing an C adsorber layer on the magnetic layer, the C adsorber layer being selected from a Ti layer, a Nb layer, a Mo layer, a W layer, a Cr layer and a V layer;

performing at least one rapid thermal anneal (RTA) of the magnetic layer and the adsorber layer at a first temperature greater than 300 degrees Celsius and not more than 425 degrees Celsius, the magnetic layer being at least partially crystallized after the at least one RTA;

performing a plasma treatment to remove at least a portion of the adsorber layer after the at least one RTA is performed and such that a portion of the magnetic layer is exposed; and depositing an additional magnetic layer after the plasma treatment.

\* \* \* \* \*